(12) United States Patent
Chang et al.

(10) Patent No.: US 11,115,051 B2
(45) Date of Patent: *Sep. 7, 2021

(54) SYSTEMS AND METHODS FOR DECODING ERROR CORRECTING CODES

(71) Applicant: Innogrit Technologies Co., Ltd., Shanghai (CN)

(72) Inventors: Yuan-mao Chang, Hsinchu (TW); Jie Chen, Milpitas, CA (US); Chung-Li Wang, Fremont, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 67 days.

This patent is subject to a terminal disclaimer.

(21) Appl. No.: 16/663,484

(22) Filed: Oct. 25, 2019

(65) Prior Publication Data
US 2020/0059243 A1 Feb. 20, 2020

Related U.S. Application Data

(63) Continuation of application No. 15/812,721, filed on Nov. 14, 2017, now Pat. No. 10,491,244.

(51) Int. Cl.
*H03M 13/00* (2006.01)
*H03M 13/11* (2006.01)
*H03M 13/37* (2006.01)

(52) U.S. Cl.
CPC .... *H03M 13/1111* (2013.01); *H03M 13/1108* (2013.01); *H03M 13/3715* (2013.01); *H03M 13/658* (2013.01)

(58) Field of Classification Search
CPC .......... H03M 13/1111; H03M 13/1108; H03M 13/3715; H03M 13/658
See application file for complete search history.

(56) References Cited

U.S. PATENT DOCUMENTS

| | | | | |
|---|---|---|---|---|
| 8,429,498 | B1* | 4/2013 | Anholt | G06F 11/1048 714/764 |
| 9,015,547 | B2* | 4/2015 | Wang | H03M 13/13 714/752 |
| 9,059,738 | B2* | 6/2015 | Chung | G06F 11/1012 |
| 9,270,296 | B1* | 2/2016 | Nemati Anaraki | G06F 11/1012 |
| 10,110,249 | B2* | 10/2018 | Zhang | G11C 29/52 |
| 10,164,656 | B2* | 12/2018 | Yang | H03M 13/3707 |
| 2010/0275096 | A1* | 10/2010 | Zhong | H03M 13/3715 714/758 |
| 2012/0054585 | A1* | 3/2012 | Jiang | H03M 13/1111 714/777 |
| 2012/0106683 | A1* | 5/2012 | Zhao | H03M 13/3905 375/341 |

(Continued)

*Primary Examiner* — Esaw T Abraham
(74) *Attorney, Agent, or Firm* — IPro, PLLC; Xiaomin Huang

(57) ABSTRACT

Systems and methods are provided for decoding a codeword encoded by a linear block code. A method may comprise performing a hard decision decoding on a codeword, determining which check nodes are satisfied and which check nodes are unsatisfied after the hard decision decoding, scheduling a check node processing order by moving at least one unsatisfied check node to be processed ahead of at least one satisfied check node and performing a soft decision decoding on the codeword according to the check node processing order.

20 Claims, 10 Drawing Sheets

(56) References Cited

U.S. PATENT DOCUMENTS

2014/0229792 A1\* 8/2014 Varnica .............. H03M 13/1108
714/759
2014/0258809 A1\* 9/2014 Nguyen ............. H03M 13/1108
714/763

\* cited by examiner

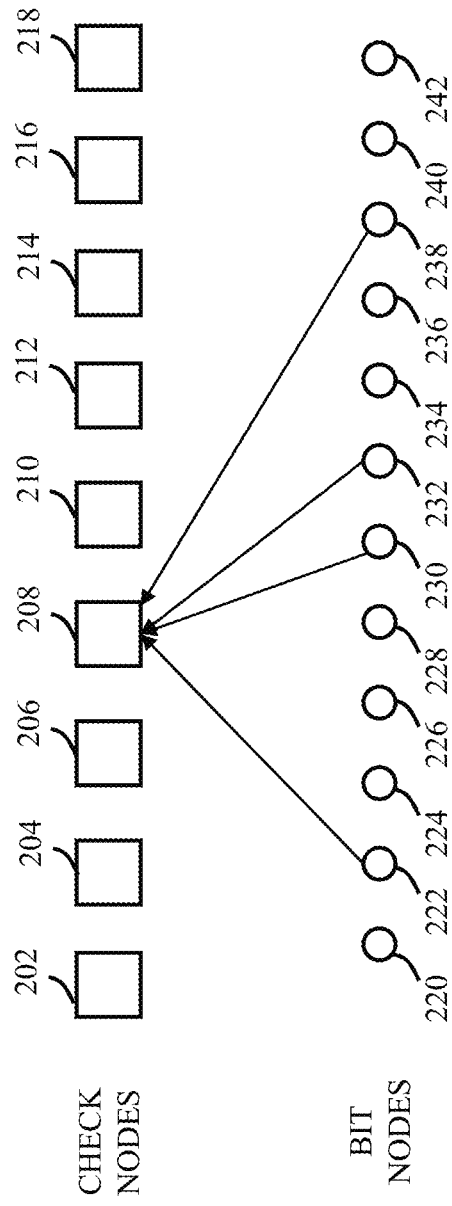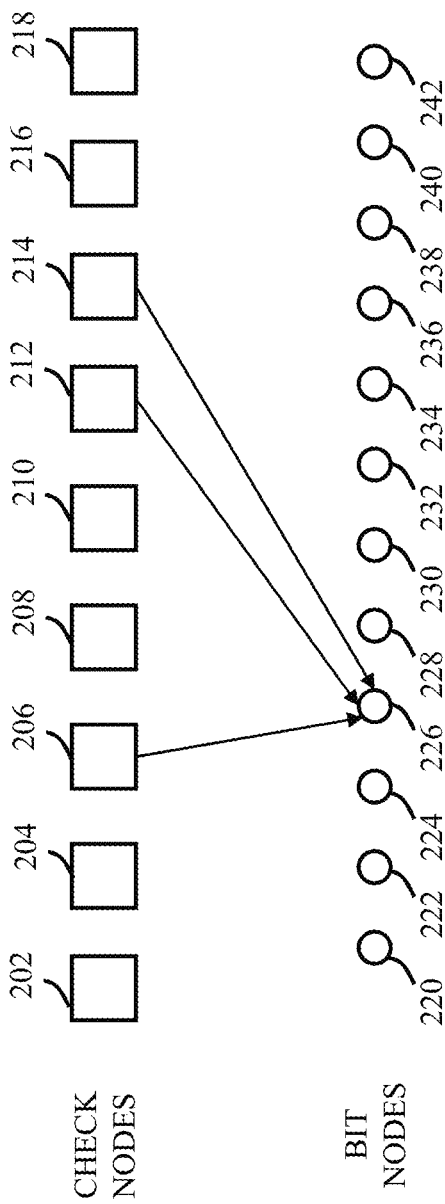

SYSTEMS AND METHODS FOR DECODING ERROR CORRECTING CODES

RELATED APPLICATIONS

This application is a continuation of U.S. patent application Ser. No. 15/812,721, filed Nov. 14, 2017, and entitled "Systems and Methods for Decoding Error Correcting Codes," which was issued as U.S. Pat. No. 10,491,244 on Nov. 26, 2019, the entire content of which is incorporated herein by reference.

TECHNICAL FIELD

The disclosure herein relates to decoding codewords encoded with parity check data, particularly relates to decoding codewords using unsatisfied check nodes information based on a decoding result.

BACKGROUND

One issue common to many data communication or storage systems is the corruption of data, for example, by noise in a communication channel or write/read processes in a storage system. One technique to remedy the data corruption is to use an error-correcting code (ECC) or forward error correction (FEC) code. ECC and FEC add redundant data or parity data to user data such that user data can be recovered by a receiver or reader even when a number of errors (up to the capability of the code being used) were introduced, for example, during the process of transmission or corruption on a storage.

A lot of different coding schemes have been developed over the years, for example, Hamming codes, Reed-Solomon codes, Turbo codes, etc. More recently, low density parity check (LDPC) codes have become widely used. All these codes, however, are computation complex and still in need of improvements.

SUMMARY

Disclosed herein is a method, comprising: performing a hard decision decoding on a codeword, determining which check nodes are satisfied and which check nodes are unsatisfied after the hard decision decoding, scheduling a check node processing order by moving at least one unsatisfied check node to be processed ahead of at least one satisfied check node and performing a soft decision decoding on the codeword according to the check node processing order.

According to an embodiment, wherein the soft decision decoding processes check nodes in batches and the check node processing order is scheduled by arranging any batch of check nodes containing at least one unsatisfied check node ahead of every batch containing only satisfied check nodes.

According to an embodiment, the method further comprises updating the check node processing order after each iteration of the soft decision decoding with updated check nodes satisfaction information.

According to an embodiment, the method further comprises determining, for a symbol value of the codeword, a number of satisfied check nodes and a number of unsatisfied check nodes for a decoding result of the hard decision decoding; generating a soft log-likelihood ratio (LLR) for the symbol value based on the number of satisfied check nodes and the number of unsatisfied check nodes; and performing the soft decision decoding on the codeword using the soft LLR as an input.

According to an embodiment, the soft LLR for the symbol value is generated based on a difference between the number of satisfied check nodes and the number of unsatisfied check nodes.

According to an embodiment, the soft LLR for the symbol value is generated according to an equation $P=((\#S-\#U)*Q+1)*D*X$, in which $\#S$ is the number of satisfied check nodes, $\#U$ is the number of unsatisfied check nodes, $Q$ is a scaling factor, $D$ is the symbol value, $X$ is an original LLR magnitude assigned to the symbol value, "*" is a multiplication sign, and the scaling factor $Q$ and the original LLR magnitude $X$ are selected to satisfy a hardware constraint.

According to an embodiment, the hard decision decoding is an iterative decoding and the soft LLR is generated after each iteration of the hard decision decoding, and the soft LLR used as the input to the soft decision decoding is the soft LLR generated after any iteration.

According to an embodiment, the method further comprises recording unsatisfied check nodes in a first array and satisfied check nodes in a second array, wherein the check node processing order is scheduled by arranging check nodes recorded in the first array to be processed ahead of check nodes recorded in the second array.

Disclosed herein is another method, comprising performing a hard decision decoding on a codeword, determining which check nodes are satisfied and which check nodes are unsatisfied after the hard decision decoding, scheduling a check node processing order for a soft decision decoding, and performing the soft decision decoding on the codeword according to the check node processing order. The soft decision decoding processes check nodes in batches and the check node processing order is scheduled by moving at least one batch of check nodes containing at least one unsatisfied check node ahead of at least one batch of check nodes containing no unsatisfied check node.

According to an embodiment, the method further comprises updating the check node processing order after each iteration of the soft decision decoding with updated check nodes satisfaction information.

According to an embodiment, the method further comprises determining, for a symbol value of the codeword, a number of satisfied check nodes and a number of unsatisfied check nodes for a decoding result of the hard decision decoding; generating a soft log-likelihood ratio (LLR) for the symbol value based on the number of satisfied check nodes and the number of unsatisfied check nodes; and performing the soft decision decoding on the codeword using the soft LLR as an input.

According to an embodiment, the soft LLR for the symbol value is generated based on a difference between the number of satisfied check nodes and the number of unsatisfied check nodes.

According to an embodiment, the soft LLR for the symbol value is generated according to an equation $P=((\#S-\#U)*Q+1)*D*X$, in which $\#S$ is the number of satisfied check nodes, $\#U$ is the number of unsatisfied check nodes, $Q$ is a scaling factor, $D$ is the symbol value, $X$ is an original LLR magnitude assigned to the symbol value, "*" is a multiplication sign, and the scaling factor $Q$ and the original LLR magnitude $X$ are selected to satisfy a hardware constraint.

According to an embodiment, the hard decision decoding is an iterative decoding and the soft LLR is generated after each iteration of the hard decision decoding, and the soft LLR used as the input to the soft decision decoding is the soft LLR generated after any iteration.

According to an embodiment, the method further comprises recording batch(es) containing unsatisfied check nodes in a first array and batch(es) satisfied check nodes in a second array, wherein the check node processing order is scheduled by arranging batch(es) of check nodes recorded in the first array to be processed ahead of batch(es) of check nodes recorded in the second array.

Disclosed herein is a system comprising a hard decision decoder comprising a bit flip control to perform a hard decision decoding on a codeword; and a soft decision decoder comprising a decoding order scheduler to determine which check nodes are satisfied and which check nodes are unsatisfied after the hard decision decoding and schedule a check node processing order by moving at least one unsatisfied check node to be processed ahead of at least one satisfied check node, and a bit node processor and a check node processor to perform a soft decision decoding on the codeword according to the check node processing order.

According to an embodiment, the decoding order scheduler is configured to process check nodes in batches, and the check node processing order is scheduled by arranging any batch of check nodes containing at least one unsatisfied check node ahead of every batch containing only satisfied check nodes.

According to an embodiment, the decoding order scheduler is configured to update the check node processing order after each iteration of the soft decision decoding with updated check nodes satisfaction information.

According to an embodiment, the system further comprises a soft log-likelihood ratio (LLR) generator comprising circuitry configured to: determine, for a symbol value of the codeword, a number of satisfied check nodes and a number of unsatisfied check nodes for a decoding result of the hard decision decoding; and generate a soft log-likelihood ratio (LLR) for the symbol value based on the number of satisfied check nodes and the number of unsatisfied check nodes, wherein the soft decision decoder further comprises circuitry to perform the soft decision decoding on the codeword using the soft LLR as an input.

According to an embodiment, the soft LLR generator is configured to generate the soft LLR according to an equation $P=((\#S-\#U)*Q+1)*D*X$, in which $\#S$ is the number of satisfied check nodes, $\#U$ is the number of unsatisfied check nodes, Q is a scaling factor, D is the symbol value, X is an original LLR magnitude assigned to the symbol value, and "*" is a multiplication sign, wherein the scaling factor Q and the original LLR magnitude X are selected to satisfy a hardware constraint.

Disclosed herein is another method, comprising performing a first iteration of hard decision decoding on a codeword, determining which bit node(s) has no unsatisfied check nodes and which bit node(s) has one or more unsatisfied check nodes, scheduling a bit node processing order by moving at least one bit node having at least one unsatisfied check node to be processed ahead of at least one bit node having no unsatisfied check node and performing a next iteration of hard decision decoding on the codeword according to the bit node processing order.

According to an embodiment, the hard decision decoding processes bit nodes in batches and the bit node processing order is scheduled by arranging any batch of bit nodes containing at least one unsatisfied check node ahead of every batch containing no unsatisfied check node.

According to an embodiment, the method further comprises recording bit node(s) having one or more unsatisfied check nodes in a first array and bit node(s) having no unsatisfied check nodes in a second array, wherein the bit node processing order is scheduled by arranging bit node(s) recorded in the first array to be processed ahead of bit nodes recorded in the second array.

According to an embodiment, the bit node processing order is updated after each iteration.

According to an embodiment, the method further comprises sending a decoding result after a final iteration to a soft decision decoder, wherein the soft decision decoder is configured to use check constraints satisfaction information in the decoding result to schedule a check node processing order in which unsatisfied check nodes are processed ahead of satisfied check nodes.

BRIEF DESCRIPTION OF FIGURES

FIGS. 2B, and 2C are graphical illustrations of information passing in a Tanner graph for a codeword, in accordance with an embodiment of the present disclosure.

DETAILED DESCRIPTION

Figure 1:
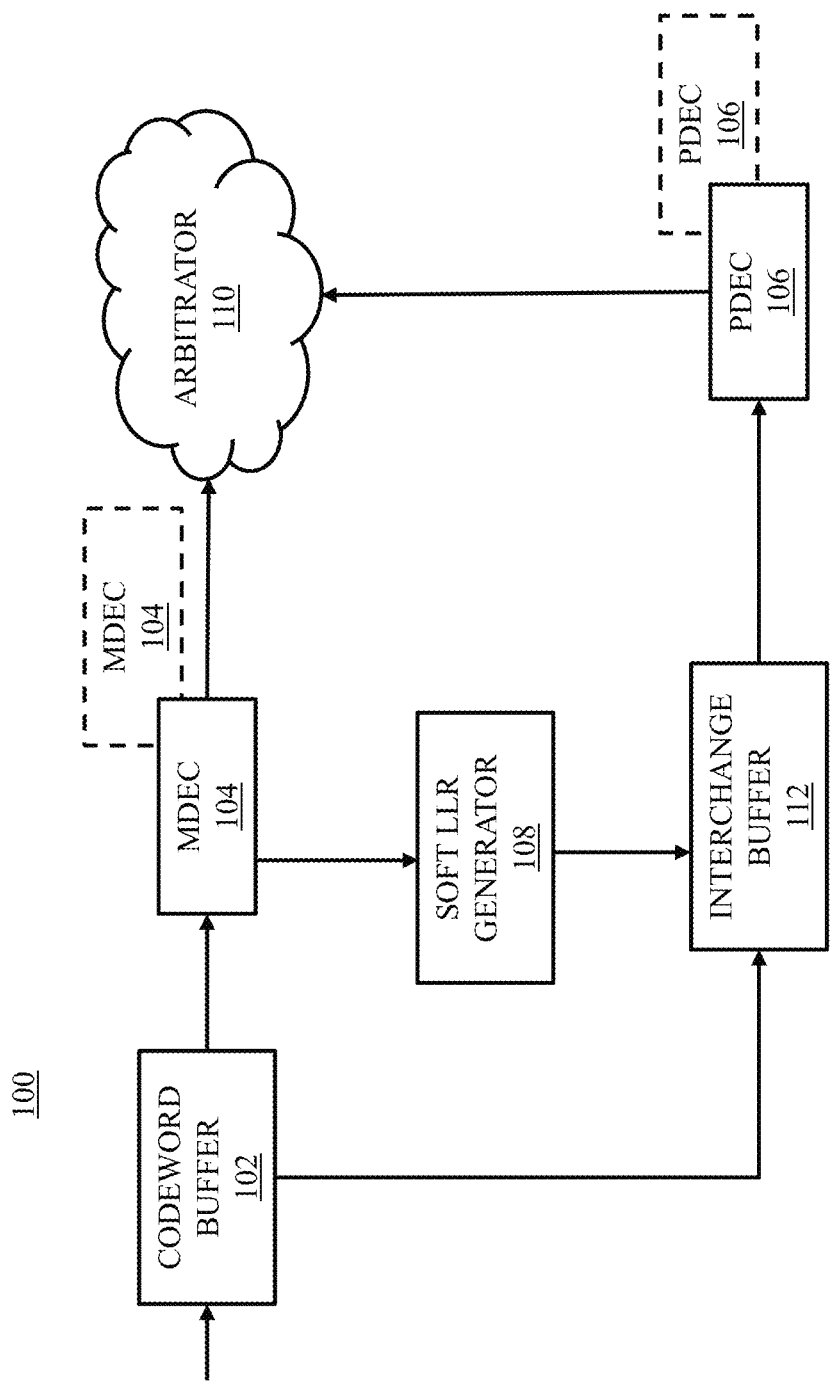
FIG. 1 schematically shows a linear block decoder in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for decoding linear block codes, such as, but not limited to, rectangular parity, the Hamming code, and the low-density parity check (LDPC) code. A linear block code may be specified by a m by n matrix H, where n is the number of bits in a codeword and m is the number of redundancy bits (e.g., parity bits). For an LDPC code, the matrix H may be a sparse matrix that has a low density of non-zero elements. An n-bit codeword $c=[c1, c2, c3, \ldots, cn]$ is a valid codeword when it satisfies the matrix equation of $Hc^T=0$, where $c^T$ is the transpose of c and the vector $\vec{s}=Hc^T$ may be referred to as the syndrome of c. Linear block codes may also be represented in graphical form by a Tanner graph. The Tanner graph corresponding to the m by n matrix H may consist of two sets of vertices: n vertices for the codeword bits (bit nodes), and m vertices for the parity-check equations (check nodes). One or more embodiments according to the present disclosure provide an approach for linear block decoding that comprises performing a first decoding on a codeword, determining the numbers of satisfied check nodes and unsatisfied check nodes for a bit node, generating a soft log-likelihood ratio (LLR) for the bit node based on the satisfied and unsatisfied check nodes, and performing a second decoding using the soft LLR as an input.

FIG. 1A schematically shows a linear block decoder 100, according to an embodiment. The linear block decoder 100 may be a composite or concatenated decoder that comprises a first decoder 104 and a second decoder 106. In addition, the linear block decoder 100 may further comprise a codeword buffer 102, a soft LLR generator 108, an arbitrator 110 and an interchange buffer 112. The codeword buffer 102 may be a temporary storage for codewords. The codewords may be received from, for example, a communication channel, or a storage (such as a memory or hard drive). The codewords may comprise valid codewords, each of which may have a syndrome of zero. That is, they satisfy the matrix equation of $Hc^T=0$. Many codewords in the codeword buffer 102, however, may be invalid. That is, these codewords do not satisfy the matrix equation of $Hc^T=0$ and need to be decoded into valid codewords. In one embodiment, the linear block decoder 100 may be an LDPC decoder.

The first decoder 104 may be a first decoder to be applied to a codeword stored in the codeword buffer 102. The first decoder 104 may receive a codeword from the codeword buffer 102 and determine whether the codeword's syndrome is zero. If the codeword's syndrome is zero, the codeword does not need to be decoded and may be sent to the arbitrator 110. The arbitrator 110 may output the codeword from the linear block decoder 100. If the codeword's syndrome is not zero, the codeword needs to be decoded. The first decoder 104 may perform a first decoding operation. The first decoding operation may be a hard decision decoding operation, which may be, for example, an iterative decoding operation, such as, but not limited to, bit-flipping algorithm known in the industry, or any other techniques yet to be developed. If the first decoding operation successfully decodes the codeword, the decoded codeword may be sent to the arbitrator 110 and the arbitrator 110 may output the decoded codeword from the linear block decoder 100. If, however, the first decoder 104 cannot successfully decode the codeword, data generated during the decoding process may be sent to the soft LLR generator 108.

In one embodiment, the first decoder 104 may be set with a pre-configured maximum number of iterations and the first decoder 104 may perform decoding operation for the pre-configured maximum number of iterations before determining that it cannot successfully decode a codeword. In another embodiment, the first decoder 104 may have convergence determination mechanism. For example, after each iteration, the first decoder 104 may determine whether there is any improvement in the codeword, such as, more check nodes become satisfied. If there is no improvement after an iteration or a configurable number of iterations, the first decoder 104 may determine it cannot successfully decode a codeword and the leave the codeword to be decoded by the second decoder 106.

The soft LLR generator 108 may be configured to generate soft log-likelihood ratio (LLR) based on decoding operation of the first decoder 104. In one embodiment, for example, after each iteration of decoding operation, for a bit node, a number of check nodes of a codeword may be satisfied and a number of check nodes of the codeword may be unsatisfied. The soft LLR generator 108 may generate a soft LLR for a bit node based on the number of satisfied check node(s) and unsatisfied check node(s). The generated LLR information may be sent to the interchange buffer 112, which may also receive the codeword from the codeword buffer 102 and supply both the LLR information and the codeword to the second decoder 106.

In one embodiment, the interchange buffer 112 may receive a processed codeword from the first decoder 104. For example, although the first decoder 104 cannot successfully decode a codeword, one or more symbol values of the codeword may be flipped after each iteration performed. The codeword with one or more symbol values flipped after the first iteration may be temporarily stored as a processed codeword after first iteration, the codeword with one or more symbol values flipped after the second iteration may be temporarily stored as a processed codeword after second iteration, and so forth. Although the soft LLR generator 108 may be shown in FIG. 1 as a component separate from the first decoder 104, in one embodiment, the soft LLR generator 108 may be implemented as part of the first decoder 104.

The second decoder 106 may be a second decoder to be applied to a codeword if the first decoder 104 fails to successfully decode the codeword. The second decoder 106 may perform a second decoding operation that may use the generated LLR information for a bit node of the codeword. The second decoding operation may be an implementation of a soft decision decoding based on belief propagation known in the industry or any soft decision algorithms yet to be developed. For example, in one embodiment, the second decoding operation may be a message passing algorithm (MPA) already known in the industry or yet to be developed, such as, but not limited to, sum-product algorithm ("SPA"), min-sum algorithm, stochastic decoding algorithm, or their variations. When the second decoder 106 successfully decode a codeword, the second decoder 106 may send the decoded codeword to the arbitrator 110 and the arbitrator 110 may output the decoded codeword from the linear block decoder 100.

In one embodiment, the first decoder 104 may be referred to as a main decoder ("MDEC") or a hard decision decoder and the second decoder 106 may be referred to as a powerful decoder ("PDEC") or a soft decision decoder. Moreover, in one embodiment, the linear block decoder 100 may comprise a plurality of first decoders 104 (e.g., two, three, four, eight, sixteen, etc.). As an example, a second first decoder 104 is shown in phantom. The plurality of first decoders 104 may perform first decoding in parallel on different codewords from the codeword buffer 102. In addition, in one embodiment, the linear block decoder 100 may comprise a plurality of second decoders 106 (e.g., two, three, four, eight, sixteen, etc.). As an example, a second second decoder 106 is shown in phantom. The plurality of second decoders 106 may perform second decoding in parallel on different codewords not successfully decoded by the first decoders 104.

In some embodiments, either the first decoder 104, the second decoder 106 or both may arrange its decoding order based on check constraints satisfaction information. Without scheduling a respective decoding order, for example, the first decoder 104 may perform its decoding according to a sequential order of bit nodes (e.g., from the first code symbol to the last code symbol in a codeword) and the second decoder 106 may perform its decoding according to a sequential order of check nodes (e.g., from the top check equation to the bottom check equation of the parity check matrix). In an embodiment in which the first decoder 104 implements scheduling a decoding order, the first decoder 104 may use the information of which code symbol of a codeword satisfies all of its parity check equations and which code symbol does not satisfy all of its parity check equations, and arrange a decoding order by moving at least one code symbol having at least one unsatisfied parity check constraint to be processed ahead of at least one code symbol that satisfies all their parity check constraints. In an embodiment in which the second decoder 106 implements scheduling a decoding order, the second decoder 106 may arrange a decoding order based on check constraints satisfaction information. The second decoder 106 may update unsatisfied check nodes because the decoder might correct them right away. Therefore, it may increase the speed of convergence. For example, the first decoder 104 may generate check constraints satisfaction information and send such information to the second decoder 106. The second decoder 106 may determine which check nodes are satisfied and which check nodes are unsatisfied after the first decoding, schedule a check node processing order by moving at least one unsatisfied check node to be processed ahead of at least one satisfied check node and perform a second decoding on the codeword according to the check node processing order.

Moreover, in at least one embodiment, the second decoder 106 may use check constraints satisfaction information generated by the first decoder 104 to arrange its decoding order regardless of whether the first decoder 104 performs decoding based on check constraints satisfaction information.

Additionally, in some embodiments, the soft LLR generator 108 may be optional. For example, in one embodiment, the second decoder 106 may use check constraints satisfaction information generated by the first decoder 104 to arrange its decoding order and may use the generated LLR information for a bit node of the codeword at the same time. In another embodiment, the second decoder 106 may use check constraints satisfaction information generated by the first decoder 104 to arrange its decoding order without any generated LLR information. In an embodiment where the second decoder 106 does not use the generated LLR information, the soft LLR generator 108 may not be needed and the first decoder 104 may generate the check constraints satisfaction information and send the check constraints satisfaction information directly to the second decoder 106 at the end of the first decoder 104's decoding process.

Figure 2A:
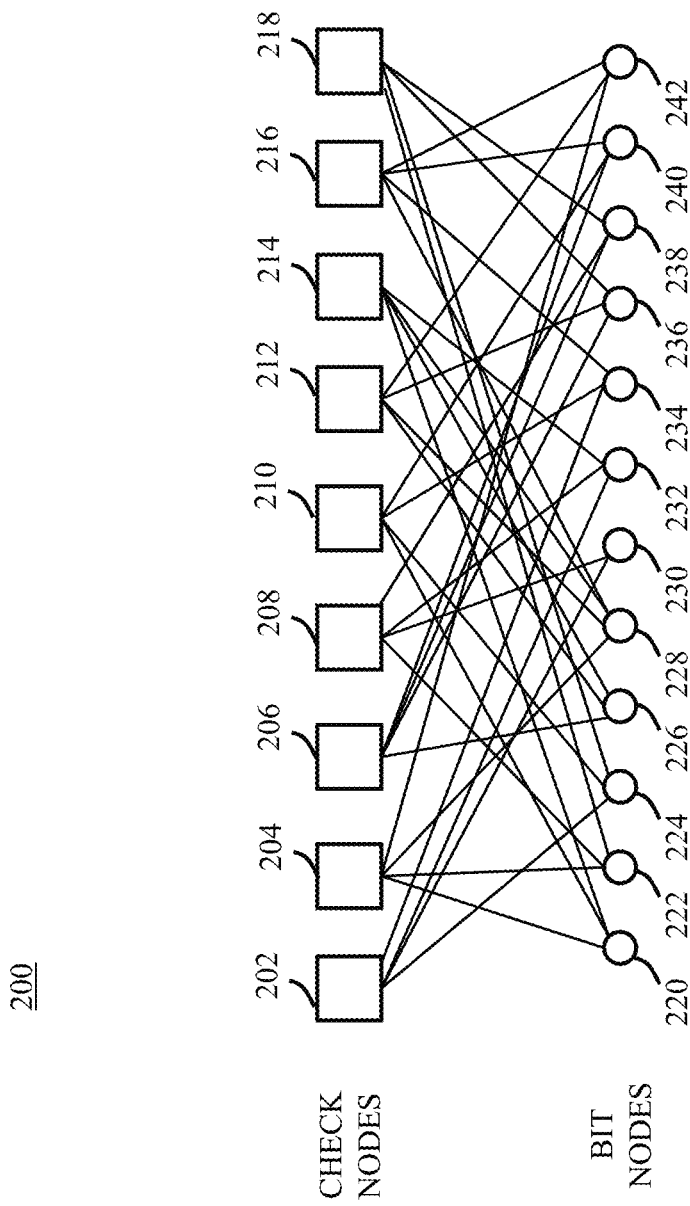
FIG. 2A is a graphical illustration of a Tanner graph for a codeword, in accordance with an embodiment of the present disclosure.

FIG. 2A is a graphical illustration of a Tanner graph 200 for a codeword, in accordance with an embodiment of the present disclosure. The Tanner graph 200 may be a bipartite graph that illustrates the parity check constraints for a block code such as a Hamming code or an LDPC code. The parity check constraints may be specified in a parity check matrix HE. For an LDPC code, the parity check matrix HE may be a low-density, sparse n by m matrix, in which n may be the number of symbols in a codeword and m is the number of check nodes. The parity check matrix HE is not necessarily unique, and may be chosen by any known techniques or any techniques to be developed in the future.

Each row of the parity check matrix HE may correspond to one of the check nodes and each column may correspond to one of the bit nodes. In a binary code, the elements of the parity check matrix are 0 or 1, but for a non-binary LDPC code, the elements of the parity check matrix may have non-binary values. Each row of the parity check matrix may form the coefficients of a parity check equation. For example, for the nodes pictured in FIG. 2A, the parity check matrix HE may be as follows:

$$\begin{matrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 1 & 0 & 0 & 0 & 1 & 1 & 0 & 0 & 1 & 0 & 0 \\ 1 & 0 & 1 & 0 & 0 & 0 & 0 & 1 & 0 & 0 & 1 & 0 \\ 0 & 0 & 0 & 1 & 1 & 0 & 0 & 0 & 1 & 0 & 0 & 1 \\ 1 & 0 & 0 & 1 & 1 & 0 & 1 & 0 & 0 & 0 & 0 & 0 \\ 0 & 0 & 0 & 0 & 0 & 1 & 0 & 1 & 0 & 0 & 1 & 1 \\ 0 & 1 & 1 & 0 & 0 & 0 & 0 & 0 & 1 & 1 & 0 & 0 \end{matrix}$$

There are two types of nodes shown in a Tanner graph. As shown in FIG. 2A, the check nodes 202, 204, 206, 208, 210, 212, 214, 216 and 218 may be denoted by squares and may represent parity check equations that a valid codeword or successfully decoded codeword must satisfy. The bit nodes 220, 222, 224, 226, 228, 230, 232, 234, 236, 238, 240 and 242 may be denoted as circles and may represent symbols (i.e., bits for a binary code) in a codeword, for example, the bit nodes 220, 222, 224, 226, 228, 230, 232, 234, 236, 238, 240 and 242 may represent $c_1$, $c_2$, $c_3$, $c_4$, $c_5$, $c_6$, $c_7$, $c_8$, $c_9$, $c_{10}$, $c_{11}$ and $c_{12}$ in a codeword $c=[c_1, c_2, c_3, c_4, c_5, c_6, c_7, c_8, c_9, c_{10}, c_{11}, c_{12}]$ respectively.

The connections between the check nodes and the bit nodes may represent parity check constraints. For example, the check node 202 may represent the first row of parity check equation specified in the parity check matrix HE shown above, which has non-zero values in columns 3, 6, 7 and 8. The symbols $c_3$, $c_6$, $c_7$ and $c_8$ in a codeword may correspond to these non-zero positions in the first row of the parity check matrix HE and the first row of parity check equation may be represented by the mathematic equation: $c_3 \oplus c_6 \oplus c_7 \oplus c_8 = 0$, where $\oplus$ is modulo-2 addition for binary codewords. Because the bit nodes 224, 230, 232 and 234 correspond to the symbols $c_3$, $c_6$, $c_7$ and $c_8$, the check node 202 may be connected to these bit nodes. That is, the check node 202 may be considered to "check" the bit nodes 224, 230, 232 and 234. Similarly, the check node 204 may represent the second row of parity check equations specified in the parity check matrix HE shown above, which has non-zero values in columns 1, 2, 5 and 12, and the second row of parity check equation may be represented by the mathematic equation: $c_1 \oplus c_2 \oplus c_5 \oplus c_{12} = 0$, where $\oplus$ is modulo-2 addition for binary codewords. Because the bit nodes 220, 222, 228 and 242 may correspond to the symbols $c_1$, $c_2$, $c_5$ and $c_{12}$, the check node 204 may be connected to these bit nodes. The check node 204 may be considered to "check" the bit nodes 220, 222, 228 and 242. The other check nodes may be connected to the bit nodes according to respective parity check constraints. It should be noted that because each row has four non-zero positions, each check node may be connected to four bit nodes.

From the bit nodes perspective, each column in the parity check matrix HE shown above may be non-zero in three rows. That is, each symbol in a codeword may be "checked" by three parity check equations. Accordingly, each bit node may be connected to three check nodes. For example, the first symbol in a codeword may be checked in the second, fifth and seventh parity check equations (the second, fifth and seventh rows of the matrix HE). The bit node 220, which may represent the first symbol in a codeword, may be connected to the check nodes 204, 210 and 214. The bit node

222, which may represent the second symbol in a codeword, may be connected to the check nodes 204, 208 and 218. The other bit nodes may be connected to the check nodes according to respective parity check constraints. The overall connections from the bit nodes' perspective are the same as that from the check nodes' perspective.

FIGS. 2B, and 2C are graphical illustrations of information passing in the Tanner graph 200 for a codeword, in accordance with an embodiment of the present disclosure. The Tanner graph 200 may be used for an iterative decoding of a codeword. As shown in FIG. 1A, the check node 208 may be connected to the bit nodes 222, 230, 232 and 238. That is, the check node 208 may "check" the bit nodes 222, 230, 232 and 238. For illustration, the arrows in FIG. 2B indicate that information may flow from the bit nodes 222, 230, 232 and 238 to the check node 208. The check node 208 may perform an operation to "check" the bit nodes 222, 230, 232 and 238 based on the information passed from these bit nodes. This may be referred to as a symbol-to-check step in an iterative decoding operation. The check nodes may perform the "check" operation according to the decoding algorithm implemented by a decoder (e.g., a hard decision algorithm, or a soft decision decoding algorithm).

In one embodiment, the information passed from the bit nodes to the check nodes may include symbol values of each bit node. For binary symbol values, for example, a modulo-2 sum of the input symbol values may be performed and whether the modulo-2 sum is zero may be determined. If the modulo-2 sum is zero, the check node may be marked as a satisfied check node. If the modulo-2 sum is non-zero, the check node may be marked as an unsatisfied check node. In another embodiment, in addition to symbol values of the bit nodes, reliability information for each symbol value, such as LLR, may be passed from the bit nodes to the check nodes. In this embodiment, in addition to determine whether a check node is satisfied or unsatisfied, a decoder may also determine how reliable (or how confidence) whether a check node is satisfied or unsatisfied.

Moreover, the Tanner graph 200 in FIG. 1A illustrates that the bit node 226 may be connected to the check nodes 206, 212 and 214. That is, the bit node 226 may be "checked" by the check nodes 206, 212 and 214. The arrows in FIG. 2C indicate that information may flow from the check nodes 206, 212 and 214 to the bit node 226. The bit node 226 may perform an operation to update its information (e.g., symbol value, reliability of the symbol value) based on the information from the check nodes 206, 212 and 214. This may be referred to as a check-to-symbol step in an iterative decoding operation.

In one embodiment, the information passed from the check nodes to the bit nodes may include the numbers of satisfied check nodes and unsatisfied check nodes for a bit node. The bit nodes may use this information to determine whether their respective symbol values need to be changed. For example, if the symbol values are binary, a bit node may flip its symbol value if more satisfied check nodes are connected to it than unsatisfied check nodes. In another embodiment, in addition to the numbers of satisfied check nodes and unsatisfied check nodes for a bit node, reliability information of how satisfied or unsatisfied for a check node may also be passed from the check nodes to the bit nodes. In this embodiment, a decoder may determine whether to update the symbol value of a bit node not only based on the numbers of satisfied and unsatisfied check nodes but also how reliable each check node is satisfied or unsatisfied.

It should be noted that binary codes may be used as examples herein. But non-binary codes, for example, linear block codes based on a Galois Field ($2^f$) with f being an integer larger than one may be used in one or more embodiments according to the present disclosure.

Figure 3:
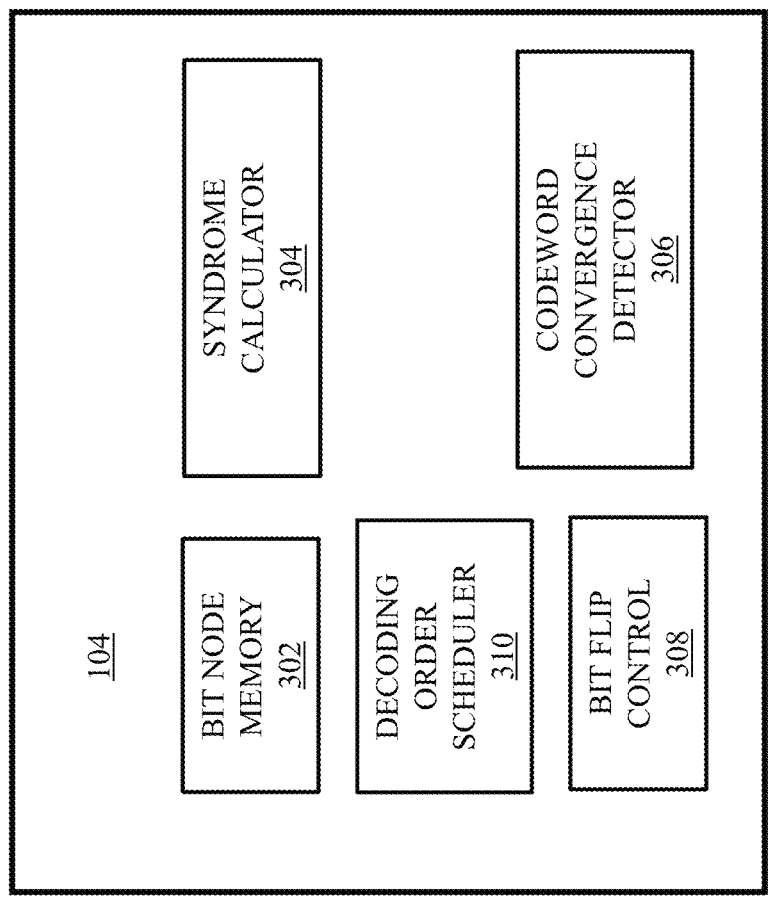
FIG. 3 schematically shows a first decoder of the linear block decoder of FIG. 1, in accordance with an embodiment of the present disclosure.

FIG. 3 schematically illustrates a component diagram of a first decoder 104, according to an embodiment. The first decoder 104 may comprise a bit node memory 320, a syndrome calculator 304, a codeword convergence detector 306 and a bit flip control 308. The bit node memory 320 may be a storage for symbol values of codewords. Before a first iteration of a decoding operation, the symbol values for a codeword in the bit node memory 302 may be the original symbol values from the codeword buffer 102. After each iteration, if the codeword does not satisfy any parity check constraints, one or more symbol values for the codeword being decoded may be changed and the symbol values for the codeword stored in the bit node memory 320 may be updated to reflect the changes.

The syndrome calculator 304 may be configured to calculate the syndrome of the codeword being decoded. For example, the syndrome calculation may include calculation of each parity check equations for a codeword. The codeword convergence detector 306 may configured to determine whether the codeword being decoded is a valid codeword based on the syndrome calculation. If the calculated syndrome for a codeword is zero, the codeword is a valid codeword and may be sent by the first decoder 104 to the arbitrator 110. If the calculated syndrome for a codeword is non-zero, the codeword is invalid. The invalid codeword may be decoded by the first decoder 104 in another iteration, or if a maximum number of iteration has been reached, the first decoder 104 may pass the check nodes satisfaction information to the LLR generator 108 and leave the codeword to be decoded by the second decoder 106.

The bit flip control 308 may comprise a bit flip threshold and may be configured to determine whether a symbol value in the codeword being decoded needs to be updated. In one embodiment, the bit flip threshold may implement a simple majority rule. For example, a bit node may be connected to a total number of T check nodes, and T=#U+#S, in which #U may represent the number of unsatisfied check nodes and #S may represent the number of satisfied check nodes. According to the simple majority rule, as long as the number of unsatisfied check nodes is larger than the number of satisfied check nodes (e.g., #U>#S), the symbol value of the bit node may be flipped in response to receiving the #U and #S information. In another embodiment, the bit flip threshold may be configured to require more than a simple majority. For example, the bit flip threshold may be that the number of unsatisfied check nodes is larger than a sum of the number of satisfied check and a number M, represented by an equation #U>#S+M. The number M may be a positive integer (e.g., 1, 2, 3, 5, 10, etc.), a percentage of the total number of T (e.g., 10% of T, 15% of T, 30% of T), a percentage of the number of unsatisfied check nodes (e.g., 10% of #U, 15% of #U, 30% of #U) or a percentage of the total number of satisfied check nodes (e.g., 10% of #S, 15% of #S, 30% of #S).

In one or more embodiments, the bit flip threshold may be configurable. For example, it may be set to one threshold to decode one set of codewords and set to another threshold to decode another set of codewords. Moreover, the bit flip threshold may be adjustable during a decoding operation. For example, it may be set to one threshold for one iteration of decoding operation and adjusted to another threshold for another iteration of decoding operation.

In some embodiments, the first decoder 104 may comprising a decoding order scheduler 310. The decoding order scheduler 310 may schedule a decoding order based on check constraints satisfaction information and perform decoding operation according to the decoding order. For example, before the first iteration, the first decoder 104 may have no check constraints satisfaction information and the first decoder 104 may be configured to perform a first iteration of decoding on a codeword. After the first iteration, some bit nodes may satisfy all their respective parity check equations (e.g., corresponding check nodes all satisfied), but some bit nodes may have one or more unsatisfied parity check equations (e.g., unsatisfied check nodes). The decoding order scheduler 310 may comprise circuitry configured to determine which bit nodes satisfy all their respective check nodes and which bit nodes have one or more unsatisfied check nodes based on check constraints satisfaction information generated in the first iteration and schedule a bit node processing order by moving bit nodes having at least one unsatisfied check node to be processed ahead of at least one bit node having no unsatisfied check nodes. The first decoder 104 may be configured to perform a next iteration of decoding on the codeword according to the bit node processing order. In one embodiment, the decoding order scheduler 310 may be configured to update the bit node processing order based on the check constraints satisfaction information generated in a preceding iteration and perform a next iteration according to the updated bit node processing order.

In some embodiments, the first decoder 104 may perform a decoding iteration by processing bit nodes in batches. Each batch may contain an integer number of bit nodes. The integer number may be a factor of the length of the codeword. For example, for a codeword with a length of 5184, the batch size may be 8, 16, 32, 48, or any integer number that 5184 may be divisible by. In another example, for a codeword with a length of 288, the batch size may be 8, 16, 32, 48, or any integer number that 288 may be divisible by. In embodiments that the first decoder 104 performs a decoding iteration by processing bit nodes in batches, the decoding order scheduler 310 may comprise circuitry configured to determine which batch may contain bit nodes that satisfy all their respective check nodes and which batch may contain one or more bit nodes that have one or more unsatisfied check nodes based on check constraints satisfaction information generated in the first iteration, and schedule a bit node processing order by moving at least one batch that contains at least one bit node having one or more unsatisfied check nodes to be processed ahead of at least one batch that contains only bit nodes having no unsatisfied check nodes. The first decoder 104 may be configured to perform a next iteration of decoding on the codeword according to the bit node processing order. In these embodiments, the bit node processing order may also be updated after the second iteration and any subsequent iterations with updated check constraints satisfaction information and the first decoder 104 may be configured to perform the following decoding iteration according to the updated decoding order. In one embodiment, the first decoder 104 may schedule the check node processing order by arranging any batch of check nodes containing at least one unsatisfied check node ahead of every batch containing only satisfied check nodes.

In some embodiments, the decoding order scheduler 310 may comprise two arrays (or queues) to record check constraints satisfaction information. For example, during or after an iteration, a bit node having one or more unsatisfied check nodes may be recorded in a first array or queue and a bit node having no unsatisfied check nodes may be recorded in a second array or queue. The bit node processing order may be scheduled by arranging all bit nodes recorded in the first array (or queue) to be processed before the bit nodes recorded in the second array (or queue). In an embodiment that the first decoder 104 processes bit codes in batches, during or after each iteration, a batch having one or more bit nodes that have one or more unsatisfied check nodes may be recorded in a first array (or queue) and a batch containing bit nodes that have no unsatisfied check may be recorded in a second array (or queue). The bit node processing order may be scheduled by arranging the batches recorded in the first array or queue to be processed before the batches recorded in the second array or queue.

It should be noted that decoding order scheduling may be optional for the first decoder 104. In embodiments that decoding order scheduling is not implemented by the first decoder 104, the decoding order scheduler 310 is not needed and the first decoder 104 may perform decoding on the bit nodes (or batches of bit nodes) sequentially, or other known or yet to be developed manner.

Figure 4:
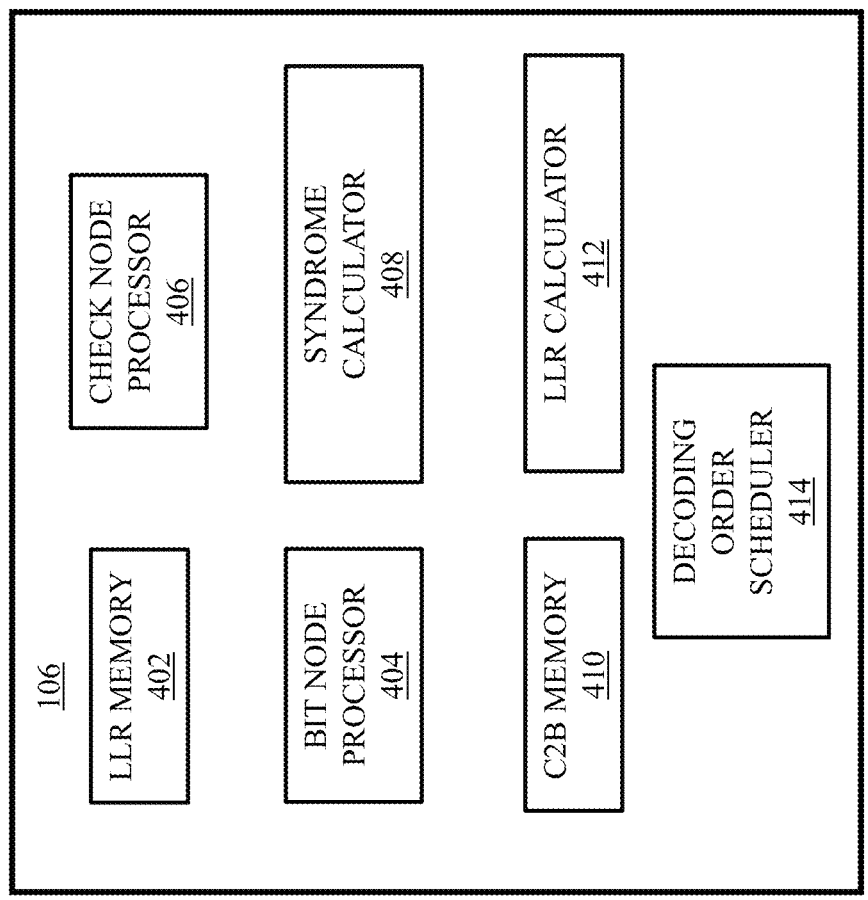
FIG. 4 schematically shows a second decoder of the linear block decoder of FIG. 1, in accordance with an embodiment of the present disclosure.

FIG. 4 schematically illustrates a component diagram of a second decoder 106, according to an embodiment. The second decoder 106 may comprise an LLR memory 402, a bit node processor 404, a check node processor 406, a syndrome calculator 408, a check-to-bit (C2B) memory 410 and an LLR calculator 412. The LLR memory 402 may be a storage for LLR information. Initially, the LLR memory 402 may store the LLR information received from the LLR generator 108. After each decoding iteration by the second decoder 106, the LLR memory 402 may store the updated LLR information generated by the LLR calculator 412.

The bit node processor 404 may be configured to perform operations based on the decoding algorithm implemented by the second decoder 106. In one embodiment, the second decoder 106 may implement a min-sum decoding algorithm and the bit node processor 404 may be configured to perform the bit nodes operations to be performed in the min-sum decoding algorithm. In another embodiment, the second decoder 106 may implement a stochastic decoding algorithm and the bit node processor 404 may be configured to perform the bit nodes operations to be performed in the stochastic decoding algorithm.

The check node processor 406 may also be configured to perform operations based on the decoding algorithm implemented by the second decoder 106. In an embodiment that the second decoder 106 implements a min-sum decoding algorithm, the check node processor 406 may be configured to perform the check nodes operations to be performed in the min-sum decoding algorithm. In another embodiment that the second decoder 106 implements a stochastic decoding algorithm, the check node processor 406 may be configured to perform the check nodes operations to be performed in the stochastic decoding algorithm.

The check-to-bit (C2B) memory 410 may be a storage for information that need to be passed from the check node processor 406 to the bit node processor 404. For example, based on the decoding algorithm implemented by the second decoder 106, the information stored in the C2B memory 410 may be the least reliable LLR and its position (e.g., corresponding to which bit node), the second to least reliable LLR and its position (e.g., corresponding to which bit node), and accumulated symbol values of bit nodes connected to a corresponding check node.

The syndrome calculator 408 may be configured to calculate the syndrome of the codeword being decoded. For example, the syndrome calculation may be calculation of each parity check equations for a codeword. If the calculation result syndrome for a codeword being decoded is zero, the codeword has been successfully codeword and may be sent by the second decoder 106 to the arbitrator 110. If the calculation result syndrome for a codeword being decoded is non-zero, the codeword has not been successfully decoded yet and another iteration may be performed by the second decoder 106.

The LLR calculator 412 may be configured to calculate soft log-likelihood ratio (LLR) based on decoding operation of the second decoder 106. In one embodiment, for example, the second decoder 106 may implement a min-sum decoding algorithm and the LLR calculator 412 may be configured to perform LLR calculations according to the min-sum decoding algorithm. In another embodiment, the second decoder 106 may implement a stochastic decoding algorithm and the LLR calculator 412 may be configured to perform LLR calculations according to the stochastic decoding algorithm. In one or more embodiments, the calculated LLR information may be passed to the LLR memory 402 for the next iteration of decoding operation.

In some embodiments, the second decoder 106 may arrange a decoding order based on check constraints satisfaction information. The second decoder 106 may update unsatisfied check nodes because the decoder might correct them right away. Therefore, it may increase the speed of convergence. For example, the first decoder 104 may generate check constraints satisfaction information and send such information to the second decoder 106. The second decoder 106 may comprise a decoding order scheduler 414 that may comprise circuitry to receive the check constraints satisfaction information sent from the first decoder 104, determine which check nodes are satisfied and which check nodes are unsatisfied after the first decoding, schedule a check node processing order by moving at least one unsatisfied check node to be processed ahead of at least one satisfied check node and perform a second decoding on the codeword according to the check node processing order. In one embodiment, the decoding order scheduler 414 may comprise circuitry to receive check constraints satisfaction information generated in a preceding iteration, update the check node processing order based on the check constraints satisfaction information generated in the preceding iteration and second decoder 106 may perform a next iteration according to the updated check node processing order.

In some embodiments, the second decoder 106 may perform a decoding iteration by processing the check nodes in batches. Each batch may contain an integer number of check nodes. The integer number may be a factor of the length of the codeword. For example, for a codeword with a length of 5184, the batch size may be 8, 16, 32, 48, or any integer number that 5184 may be divisible by. In another example, for a codeword with a length of 288, the batch size may be 8, 16, 32, 48, or any integer number that 288 may be divisible by. In embodiments that the second decoder 106 performs a decoding iteration by processing check nodes in batches, the decoding order scheduler 414 may comprise circuitry configured to determine which batch may contain no unsatisfied check nodes and which batch may contain one or more unsatisfied check nodes based on check constraints satisfaction information (e.g., from the first decoder 104, or from a preceding decoding iteration), and schedule a check node processing order by moving at least one batch that contains at least one unsatisfied check node to be processed ahead of at least one batch that contains no unsatisfied check nodes. The second decoder 106 may be configured to perform a next iteration of decoding on the codeword according to the check node processing order. In these embodiments, the decoding order scheduler 414 may update the check node processing order based on the check constraints satisfaction information generated in a preceding iteration and the second decoder 106 may perform a next iteration according to the updated check node processing order. In one embodiment, the decoding order scheduler 414 may be configured to schedule the check node processing order by arranging any batch of check nodes containing at least one unsatisfied check node ahead of every batch containing only satisfied check nodes.

In some embodiments, the decoding order scheduler 414 may comprise two arrays (or queues) to record check constraints satisfaction information. The decoding order scheduler 414 may comprise a circuitry to receive the check constraints satisfaction information sent from the first decoder 104, record check node(s) containing one or more unsatisfied check nodes in a first array (or queue) and check node(s) containing no unsatisfied check nodes in a second array (or queue), schedule a check node processing order by arranging the check node(s) recorded in the first array (or queue) to be processed ahead of the check node(s) recorded in the second array (or queue). During or after an iteration, the decoding order scheduler 414 may be configured to record unsatisfied check nodes in the first array (or queue) and satisfied check nodes in the second array (or queue), schedule a check node processing order by arranging the check nodes recorded in the first array (or queue) to be processed before the check nodes recorded in the second array (or queue). The second decoder 106 may be configured to perform a next iteration of decoding according to the check node processing order. In an embodiment that the second decoder 106 processes check codes in batches, the decoding order scheduler 414 may be configured to record any batch containing one or more unsatisfied check nodes in the first array (or queue) and batches containing only satisfied check may in the second array (or queue), and schedule a check node processing order by arranging batch(es) of check nodes recorded in the first array (or queue) to be processed before batch(es) of check nodes recorded in the second array (or queue).

Figure 5:
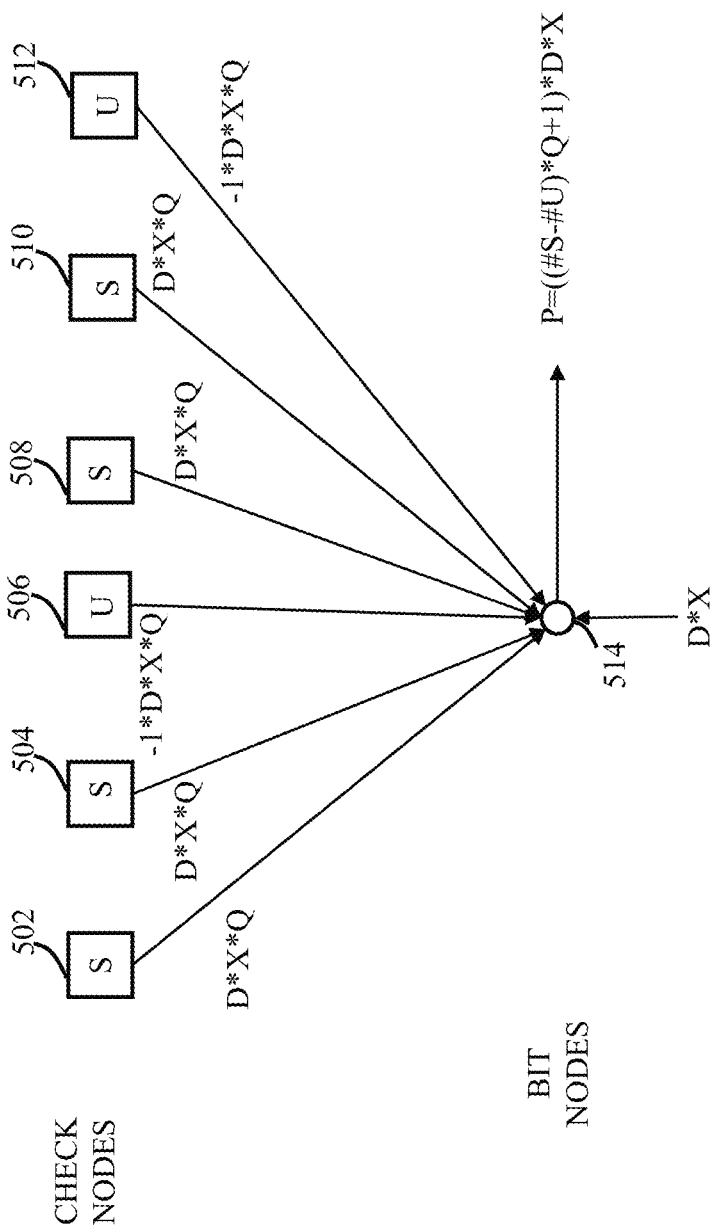
FIG. 5 schematically shows LLR generation, in accordance with an embodiment of the present disclosure.

FIG. 5 schematically illustrates LLR generation in accordance with an embodiment of the present disclosure. The Tanner graph in FIG. 5 may be a partial Tanner graph for a parity check matrix in which each bit node may be "checked" by six check nodes. For example, as shown in FIG. 5, a bit node 514 may be connected to six check nodes 502, 504, 506, 508, 510 and 512. After a symbol-to-check step in one decoding iteration, the check nodes 502, 504, 508 and 510 may be satisfied, and the check nodes 506 and 512 may be unsatisfied, a soft LLR may be generated based on the number of satisfied check nodes (e.g., #S) and the number of unsatisfied check nodes (e.g., #U).

In one embodiment, an original LLR magnitude may be assigned a value of X, a scale factor may be assigned a value of Q, a symbol value for a bit node may be represented as D, then the soft LLR may be generated as $P = \#S*Q*D*X - \#U*Q*D*X + D*X = (\#S*Q - \#U*Q + 1)*D*X = ((\#S - \#U)*Q + 1)*D*X$, in which "*" is a multiplication sign. For example, as shown in FIG. 5, four check nodes 502, 504, 508 and 510 may be satisfied, and the check nodes 506 and 512 may be unsatisfied. Accordingly, #S is four (4) and #U is two (2). If the original LLR magnitude X=8, the scaling factor Q=0.5, and the symbol value of the bit node 514 D=+1, the soft LLR P may be generated as $P=((4-2)*0.5+1)*8*1=16$. In another example, after a symbol-to-check step in one decoding iteration, #S may be one (1) and #U may be five (5). If the original LLR magnitude X=8, the scaling factor Q=0.5, and the symbol value of the bit node 514 D=+1, the soft LLR P may be generated as P=((1−5)*0.5+1)*8*1=−8.

In some embodiments, the soft LLR and any subsequently calculated LLR may have a hardware constraint. For example, the soft LLR and any subsequently calculated LLR may have a finite bandwidth, such as, but not limited to, four (4) bits, five (5) bits, six (6) bits, seven (7) bits or eight (8) bits, and one of the bits may be a sign bit (e.g., the most significant bit (MSB)). The original LLR magnitude X and the scaling factor Q may be selected to satisfy the hardware constraint. For example, the values for X and Q may be any number such that the generated soft LLR value and any subsequently calculated LLR values fall within a value range limited by the finite bandwidth. In addition, in some embodiments, the values for X and Q may be selected such that the generated soft LLR value and any subsequently calculated LLR values not only fall within the value range limited by the finite bandwidth but also cover as large a range as possible. In one embodiment, for example, a binary system with a bit error rate (BER) may have an LLR calculated based on the BER, and the calculated LLR may be scaled to an integer and selected as the original LLR magnitude X. The scaling factor may be determined by simulation.

In one embodiment, for a binary codeword, the symbol value D of the bit node may be either +1 or −1, which may be the original symbol value from the codeword buffer 102, or flipped by the first decoder 104 in an immediate preceding decoding iteration.

In one or more embodiments, the soft LLR generation illustrated in FIG. 5 may be implemented in the soft LLR generator 108. In one embodiment, the soft LLR may be generated after a configurable number of decoding iterations by the first decoder 104. For example, the configurable number may be one, two, three, or the maximum number of iterations configured for the first decoder 104 and the linear block decoder 100 may be configured to use the generated soft LLR as an input for the second decoder 106 regardless of how many decoding operations finally having been performed by the first decoder 104. In another embodiment, the soft LLR may be generated after each decoding iteration by the first decoder 104 and the linear block decoder 100 may be configured to select any one of the generated soft LLR as an input for the second decoder 106 regardless of how many decoding operations finally having been performed by the first decoder 104. In yet another embodiment, the soft LLR generator 108 may be configured to generate soft LLR for several selected iterations, for example, after the first iteration, the third iteration, the fifth iterations, etc., and which iterations to select may be configurable.

Figure 6:
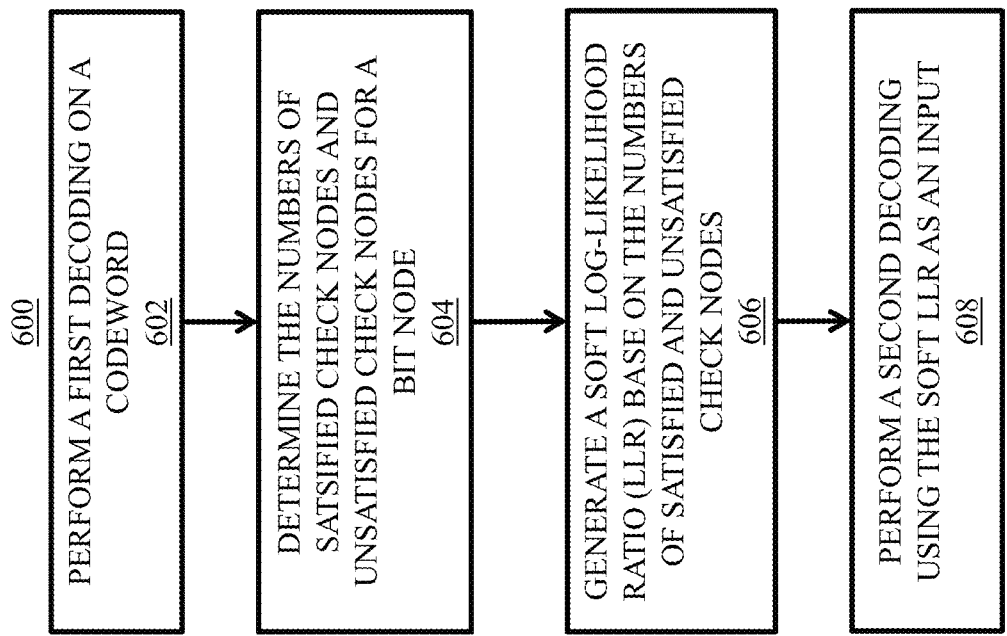
FIG. 6 is a flow diagram of a process for decoding a codeword using generated soft LLR, in accordance with an embodiment of the present disclosure.

FIG. 6 shows a flow chart for a process 600 to decode a linear block codeword according to an embodiment. In block 602, a first decoding may be performed on a codeword. For example, the first decoder 104 may retrieve a codeword from the codeword buffer 102 and perform a first decoding operation on the codeword. In block 604, the numbers of satisfied check nodes and unsatisfied check nodes may be determined for a bit node. For example, after an iteration of the first decoding operation, which may be the first iteration, the second iteration, or any number of iterations, the number of satisfied check nodes and the number of unsatisfied check nodes may be determined for a bit node. In block 606, a soft LLR for a bit node may be generated based on the numbers of satisfied and unsatisfied check nodes. As shown in FIG. 5 and described herein, a soft LLR P for a bit node may be generated based on the numbers of satisfied and unsatisfied check nodes. In block 608, a second decoding may be performed using the soft LLR as an input. For example, the second decoder 106 may use the soft LLR information for a bit node to perform a second decoding operation on a codeword.

Figure 7:
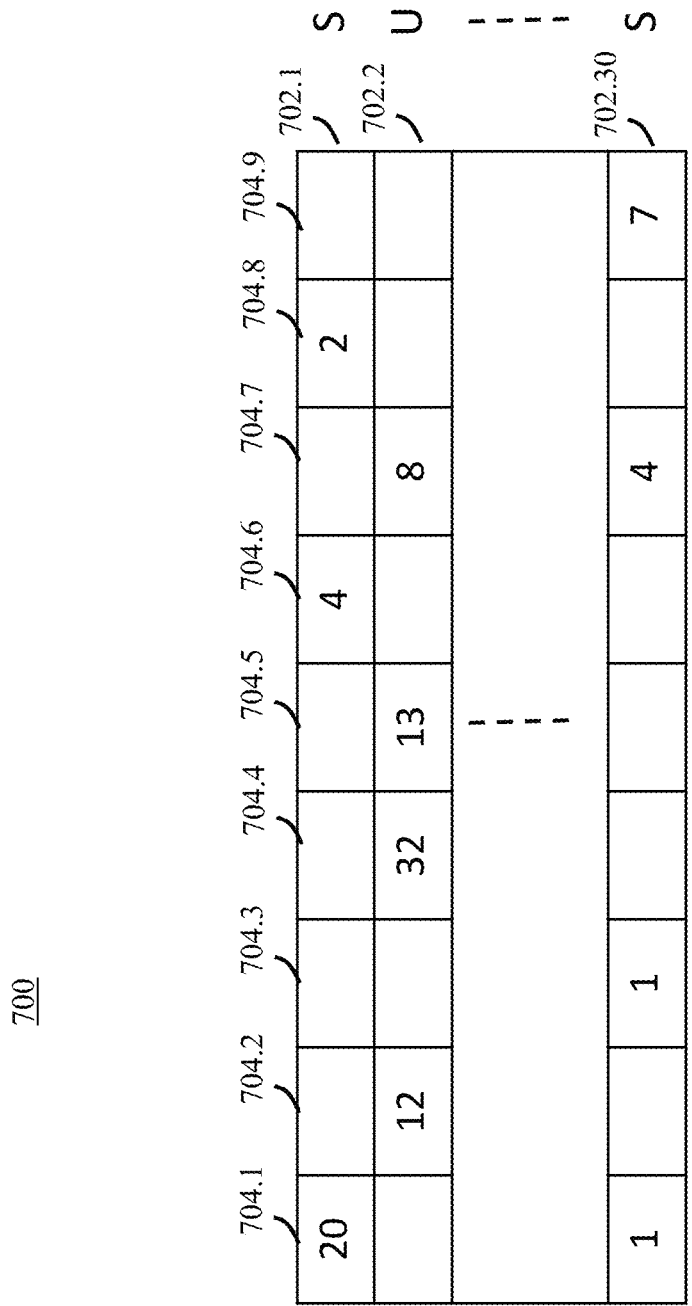
FIG. 7 schematically shows a parity check matrix for an LDPC code in accordance with an embodiment of the present disclosure.

Some LDPC codes suitable for use by a linear block decoder 100 may include quasi-cyclic (QC) LDPC codes in which the parity check matrix comprises a plurality of square submatrices that are either zero, unity, or cyclically-shifted unity matrices, although the scope of the invention is not limited in this respect. FIG. 7 schematically shows a parity check matrix 700 for an QC LDPC code in accordance with an embodiment of the present disclosure. The parity check matrix 700 may comprise 9×30 square with 9 columns and 30 rows of square submatrices. For illustration purpose, only the rows 702.1, 702.2 and 702.30 of the 30 rows of square submatrices, and columns 704.1, 704.2, 704.3, 704.4, 704.5, 704.6, 704.7, 704.8 and 704.9 of the square submatrices may be labeled. Each square submatrix may be a Z×Z square submatrix with Z being an integer number. In an embodiment that a linear block decoder 100 may implement scheduling a bit node processing order in batches, the number Z may be the batch size of bit nodes in arranging the bit node processing order. In an embodiment that a linear block decoder 100 may implement scheduling a check node processing order in batches, the number Z may be the batch size of check nodes in arranging the check node processing order. In the embodiment shown in FIG. 7 each square submatrix of the parity check matrix 700 may comprise 32 rows and 32 columns of elements but the number Z can be another number that is a factor of the codeword length as described herein with respect to batch sizes for the bit nodes or check nodes.

A square submatrix may be a zero square, meaning all elements in the square submatrix is zero, and such a square submatrix may be shown as an empty square submatrix. For example, counting from the left, the second, third, fourth, fifth, seventh and ninth square submatrices of the row 702.1 may be zero square submatrices.

Or a square may be a non-zero square, which may be referred to as a circulant matrix. A circulant matrix may be a unity square submatrix or a cyclically-shifted square submatrix. A unity square submatrix may be a square matrix that every diagonal element from the top left corner to the bottom right corner may be one and all other elements may be zero. In one embodiment, a unity square submatrix may be denoted by a number zero ("0"). A cyclically-shifted unity square submatrix may be a unity square matrix with each element cyclically shifted a fixed number of times. A cyclically shift may mean each element in a row being moved to an adjacent element's position in a shifting direction with the end element of the row being moved to the beginning element's position. In one embodiment, a cyclically-shifted unity square submatrix may be obtained by cyclically shifting all of elements of a unity square submatrix to the right a fixed number of times and denoted by the fixed number of cyclic right shifts. For example, the square submatrix located at column 704.1 and row 702.1 may be denoted by the number 20 because it may be a unity square submatrix right cyclically-shifted 20 times.

It should be noted that the parity check matrix HE corresponding to the Tanner graph in FIG. 2A may corresponding to a regular LDPC code, in which every code digit may be contained in the same number of equations and each equation may contain the same number of code symbols. For example, each row of the parity check matrix HE, which may correspond to a parity check equation, may contain four code symbols marked by ones, and each code symbol may be contained in three parity check equations. In contrast, the parity check matrix 700 may correspond to an irregular LDPC code that may have a variable number of 1's in the rows and in the columns. For example, the row 702.1 may contain three non-zero square submatrices, meaning three code symbols may be contained in each parity check equation in the row 702.1. In the example shown in FIG. 7, there may be 32 rows of elements in each square submatrices of the row 702.1, and thus the 702.1 may correspond to 32 parity check equations each may "check" three code symbols. The row 702.2 may contain four non-zero square submatrices and correspond to 32 parity check equations each may "check" four code symbols. These examples show that both regular and irregular LDPC codes may be implemented in embodiments according to the present disclosure.

In embodiments in which the linear block decoder 100 implements scheduling a check node processing order in batches, a decoding result may include check constraints satisfaction information that may indicate which row(s) of square submatrices of a parity check matrix contains one or more unsatisfied check nodes and which row(s) of square submatrices of the parity check matrix contains only satisfied check nodes. And a check node processing order may be scheduled by arranging row(s) of square submatrices of the parity check matrix containing one or more unsatisfied check nodes to be processed before every row(s) of square submatrices of the parity check matrix containing only satisfied check nodes. The decoding result may be from the first decoder 104 or a decoding iteration of the second decoder 106. As an example, 30 rows of square submatrices of FIG. 7 may correspond to 30 batches of check nodes for a decoding operation. In one exemplary decoding result, the batches 2, 3, 5, 9, 10 and 25 may each contain one or more unsatisfied check nodes and batches 1, 4, 6-8, 11-24 and 26-30 may each contain only satisfied check nodes. As illustrated in FIG. 7, the row 702.1 may correspond to batch 1 and may be denoted by a "S" to the right to indicate that batch 1 contains only satisfied check nodes, the row 702.2 may correspond to batch 2 and may be denoted by a "U" to the right to indicate that batch 2 contains one or more unsatisfied check nodes, and the row 702.30 may correspond to batch 30 and may be denoted by a "S" to the right to indicate that batch 30 contains only satisfied check nodes. The check node processing order may be scheduled by moving at least one of check node batches 2, 3, 5, 9, 10 and 25 to be processed before at least one of check node batches 1, 4, 6-8, 11-24 and 26-30 (e.g., the check node batch 25 moved before the check node batch 1). In one embodiment, the check node processing order may be scheduled by arranging check node batches 2, 3, 5, 9, 10 and 25 to be processed before check node batches 1, 4, 6-8, 11-24 and 26-30.

Figure 8:
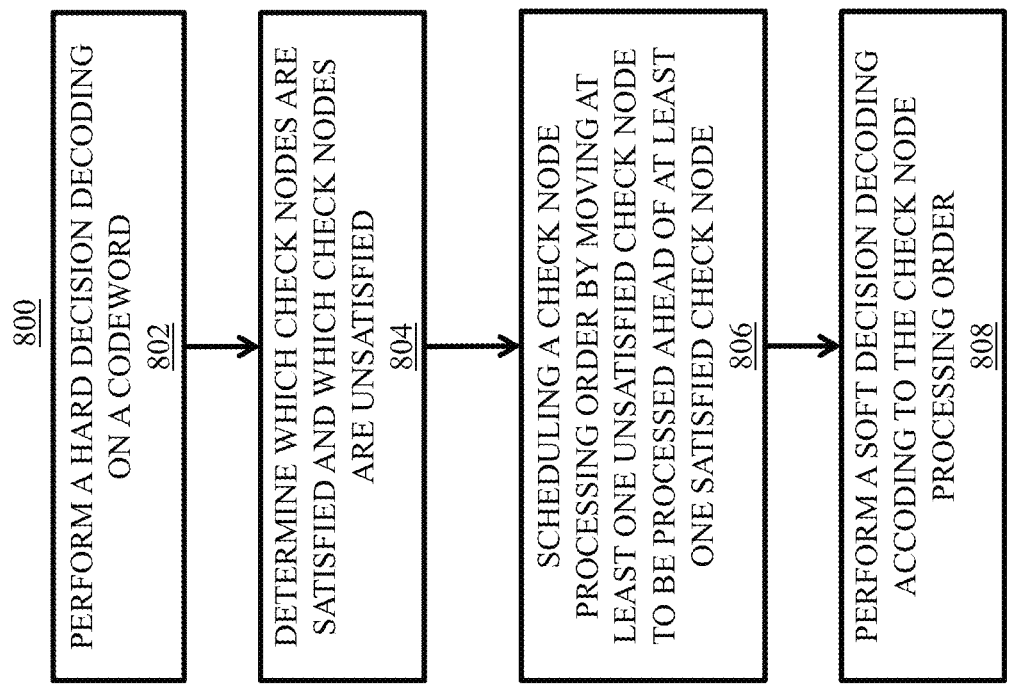
FIG. 8 is a flow diagram of a process for decoding a codeword using check nodes satisfaction information in accordance with an embodiment of the present disclosure.

FIG. 8 is a flow chart for a process 800 to decode a linear block codeword using check nodes satisfaction information according to an embodiment. In block 802, a hard decision decoding may be performed on a codeword. For example, the first decoder 104 may retrieve a codeword from the codeword buffer 102 and perform a hard decision decoding operation on the codeword. In block 804, which check node(s) may satisfied and which check node(s) may be unsatisfied may be determined. For example, at the end of the hard decision decoding operation, the decoding result including check constraints satisfaction information may be passed over to the second decoder 106, which may be configured to determine which check nodes are satisfied and which check nodes are unsatisfied. In block 806, a check node processing order may be scheduled by moving at least one unsatisfied check node to be processed ahead of at least one satisfied check node. As shown in FIG. 5 and described herein, the check node processing order may be scheduled for check nodes (or batches of check nodes). In block 808, a soft decision decoding may be performed according to the check node processing order. For example, the second decoder 106 may be a soft decision decoder and configured to perform a second decoding operation on a codeword according to the check node processing order.

Embodiments of the processes disclosed herein (including the processes 600 and 800) may be implemented using software (e.g., executable by a computer processor (e.g., a central processing unit (CPU), a graphics processing unit (GPU), or both)), hardware (e.g., a field-programmable gate array (FPGA) or an application-specific IC (ASIC), firmware, or any suitable combination of the three. In one embodiment, for example, the components of the linear block decoder 100 may be implemented in hardware circuity and the processes may be carried on in hardware.

In another embodiment, for example, the components of the linear block decoder 100 and any of the disclosed methods and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Figure 9:
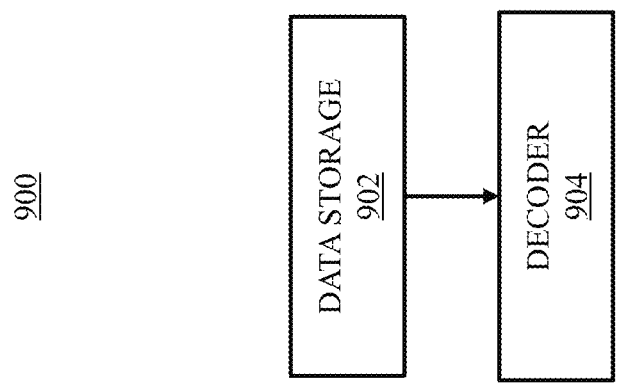
FIG. 9 schematically shows a storage system with error correction in accordance with an embodiment of the present disclosure.

FIG. 9 schematically shows a system 900 comprising the linear block decoder 100 described herein. The system 900 may be a storage system, such as, but not limited to a memory, or a hard drive system. The system 900 may comprise a data storage 902 and a decoder 904. The data storage 902 may be, for example, a memory or a hard drive. The decoder 904 may be an embodiment of the linear block decoder 100 shown in FIG. 1. Data read from the data storage 902 may be corrupt and the decoder 904 may decode the corrupt data and recover the correct data information.

Figure 10:
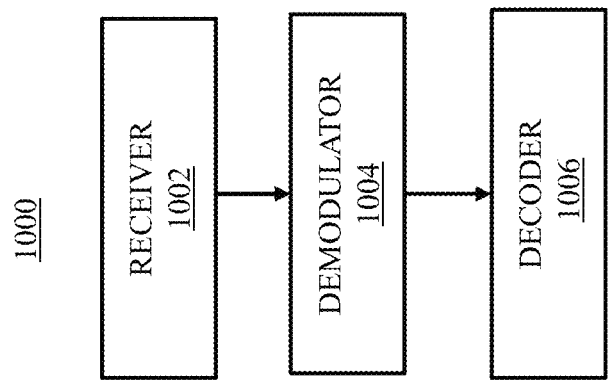
FIG. 10 schematically shows a communication system with error correction in accordance with an embodiment of the present disclosure.

FIG. 10 schematically shows another system 1000 comprising the linear block decoder 100 described herein. The system 1000 may be a communication system, such as, but not limited to a wired or wireless communication system. The system 1000 may comprise a receiver 1002, a demodulator 1004 and a decoder 1006. The receiver 1002 may be, for example, an antenna for a wireless communication or a receiver in a wired communication. The demodulator 1004 may be configured to demodulate the signals received by the receiver 1002 and generate digital signals. The decoder 1006 may be an embodiment of the linear block decoder 100 shown in FIG. 1. Data received by the receiver 1002 may be corrupt and the decoder 1006 may decode the corrupt data and recover the correct data information.

Exemplary components, operations and techniques described herein may be implemented in various embodiments independently or in combination. For example, one embodiment may implement the feature of soft LLR generation (e.g., the soft LLR generator 108) and using the soft LLR as an input to a second decoder without the features of scheduling decoding order by either the first decoder or the second decoder. Another embodiment may implement the feature of scheduling decoding order in the second decoder without the features of soft LLR generation or scheduling decoding order by the first decoder. Yet another embodiment may implement the feature of scheduling decoding order in the first decoder without the features of soft LLR generation or scheduling decoding order in the second decoder. And other embodiments may implement combination of some or all of these features.

It should be noted that, in several examples and embodiments, LDPC may be used as an example for linear block codes. Embodiments according to the present disclosure, however, may be implemented for other types of linear block codes, such as, but not limited to, rectangular parity and the Hamming code. For example, in one embodiment, the linear block decoder 100 may be implemented for the Hamming code as a Hamming code decoder, and the first decoder 104 and second decoder 106 may implement decoding operations for the Hamming code. Moreover, the word "code" such as used in the "linear block code," "LDPC code" or "Hamming code," may refer to the type of code in general. And the word "codeword" may refer to a unit block of data encoded with a linear block code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
performing a hard decision decoding on a codeword to generate check constraints satisfaction information by a hard decision decoder, the hard decision decoding being based on a parity check matrix for the codeword being represented in a bipartite graph with symbols in the codeword represented as bit nodes and parity check equations for the codeword represented as check nodes, and the check constrains satisfaction information including which parity check equations are satisfied and which parity check equations are unsatisfied;
sending the check constraints satisfaction information from the hard decision decoder to a soft decision decoder;
determining which check nodes are satisfied and which check nodes are unsatisfied based on which parity check equations are satisfied and which parity check equations are unsatisfied in the check constraints satisfaction information generated by the hard decision decoder;
scheduling a check node processing order based on which parity check equations are satisfied and which parity check equations are unsatisfied in the check constraints satisfaction information generated by the hard decision decoder by moving at least one unsatisfied check node that would be processed after at least one satisfied check node in a sequential order to be processed ahead of the at least one satisfied check node, the sequential order being an order of the parity check equations in the parity check matrix; and
performing a soft decision decoding by the soft decision decoder on the codeword to go over the parity check equations in the parity check matrix according to the check node processing order.

2. The method of claim 1, wherein the soft decision decoding processes the check nodes in batches and the check node processing order is scheduled by arranging any batch of check nodes containing at least one unsatisfied check node ahead of every batch containing only satisfied check nodes.

3. The method of claim 1, further comprising updating the check node processing order after each iteration of the soft decision decoding with updated check nodes satisfaction information.

4. The method of claim 1, further comprising:
determining, for a symbol value of the codeword, a number of satisfied check nodes and a number of unsatisfied check nodes for a decoding result of the hard decision decoding;
generating a soft log-likelihood ratio (LLR) for the symbol value based on the number of satisfied check nodes and the number of unsatisfied check nodes; and
performing the soft decision decoding on the codeword using the soft LLR as an input.

5. The method of claim 4, wherein the soft LLR for the symbol value is generated based on a difference between the number of satisfied check nodes and the number of unsatisfied check nodes.

6. The method of claim 5, wherein the soft LLR for the symbol value is generated according to an equation $P=((\#S-\#U)*Q+1)*D*X$, in which P is the soft LLR for the symbol value, $\#S$ is the number of satisfied check nodes, $\#U$ is the number of unsatisfied check nodes, Q is a scaling factor, D is the symbol value, X is an original LLR magnitude assigned to the symbol value, "*" is a multiplication sign, and the scaling factor Q and the original LLR magnitude X are selected to satisfy a hardware constraint.

7. The method of claim 4, wherein the hard decision decoding is an iterative decoding and the soft LLR is generated after each iteration of the hard decision decoding, and the soft LLR used as the input to the soft decision decoding is the soft LLR generated after any iteration.

8. The method of claim 1, further comprising recording unsatisfied check nodes in a first array and satisfied check nodes in a second array, wherein the check node processing order is scheduled by arranging check nodes recorded in the first array to be processed ahead of check nodes recorded in the second array.

9. A method, comprising:
performing a hard decision decoding on a codeword to generate check constraints satisfaction information by a first decoder, the hard decision decoding being based on a parity check matrix for the codeword being represented in a bipartite graph with symbols in the codeword represented as bit nodes and parity check equations for the codeword represented as check nodes, the check constraints satisfaction information including which parity check equations are satisfied and which parity check equations are unsatisfied;
sending the check constraints satisfaction information from the first decoder to a second decoder;
determining which check nodes are satisfied and which check nodes are unsatisfied based on which parity check equations are satisfied and which parity check equations are unsatisfied in the check constraints satisfaction information generated by the first decoder;

scheduling a check node processing order for a soft decision decoding based on which parity check equations are satisfied and which parity check equations are unsatisfied in the check constraints satisfaction information generated by the first decoder, wherein the soft decision decoding processes the check nodes in batches and the check node processing order is scheduled by moving at least one batch of check nodes containing at least one unsatisfied check node that would be processed after at least one batch of check nodes containing no unsatisfied check node in a sequential order ahead of the at least one batch of check nodes containing no unsatisfied check node, the sequential order being an order of the parity check equations in the parity check matrix; and performing the soft decision decoding by the second decoder on the codeword to go over the parity check equations in the parity check matrix according to the check node processing order.

10. The method of claim 9, further comprising updating the check node processing order after each iteration of the soft decision decoding with updated check nodes satisfaction information.

11. The method of claim 9, further comprising:
determining, for a symbol value of the codeword, a number of satisfied check nodes and a number of unsatisfied check nodes for a decoding result of the hard decision decoding;
generating a soft log-likelihood ratio (LLR) for the symbol value based on the number of satisfied check nodes and the number of unsatisfied check nodes; and
performing the soft decision decoding on the codeword using the soft LLR as an input.

12. The method of claim 11, wherein the soft LLR for the symbol value is generated based on a difference between the number of satisfied check nodes and the number of unsatisfied check nodes.

13. The method of claim 12, wherein the soft LLR for the symbol value is generated according to an equation P=((#S−#U)*Q+1)*D*X, in which P is the soft LLR for the symbol value, #S is the number of satisfied check nodes, #U is the number of unsatisfied check nodes, Q is a scaling factor, D is the symbol value, X is an original LLR magnitude assigned to the symbol value, "*" is a multiplication sign, and the scaling factor Q and the original LLR magnitude X are selected to satisfy a hardware constraint.

14. The method of claim 11, wherein the hard decision decoding is an iterative decoding and the soft LLR is generated after each iteration of the hard decision decoding, and the soft LLR used as the input to the soft decision decoding is the soft LLR generated after any iteration.

15. The method of claim 9, further comprising recording batch(es) containing unsatisfied check nodes in a first array and batch(es) satisfied check nodes in a second array, wherein the check node processing order is scheduled by arranging batch(es) of check nodes recorded in the first array to be processed ahead of batch(es) of check nodes recorded in the second array.

16. A system, comprising:
a hard decision decoder comprising a bit flip control to perform a hard decision decoding on a codeword and generate check constraints satisfaction information, the hard decision decoding being based on a parity check matrix for the codeword being represented in a bipartite graph with symbols in the codeword represented as bit nodes and parity check equations for the codeword represented as check nodes, the check constraints satisfaction information including which parity check equations are satisfied and which parity check equations are unsatisfied; and a soft decision decoder coupled to the hard decision decoder to receive the check constraints satisfaction information sent from the hard decision decoder, the soft decision decoder comprising:
a decoding order scheduler to:
determine which check nodes are satisfied and which check nodes are unsatisfied based on which parity check equations are satisfied and which parity check equations are unsatisfied in the check constraints satisfaction information generated by the hard decision decoder; and
schedule a check node processing order based on which parity check equations are satisfied and which parity check equations are unsatisfied in the check constraints satisfaction information generated by the hard decision decoder by moving at least one unsatisfied check node to be processed that would be processed after at least one batch of check nodes containing no unsatisfied check node in a sequential order ahead of at least one satisfied check node, the sequential order being an order of the parity check equations in the parity check matrix; and
a bit node processor and a check node processor to perform a soft decision decoding on the codeword to go over the parity check equations in the parity check matrix according to the check node processing order.

17. The system of claim 16, wherein the decoding order scheduler is configured to process the check nodes in batches, and the check node processing order is scheduled by arranging any batch of check nodes containing at least one unsatisfied check node ahead of every batch containing only satisfied check nodes.

18. The system of claim 16, wherein the decoding order scheduler is configured to update the check node processing order after each iteration of the soft decision decoding with updated check nodes satisfaction information.

19. The system of claim 16, further comprising a soft log-likelihood ratio (LLR) generator comprising circuitry configured to:
determine, for a symbol value of the codeword, a number of satisfied check nodes and a number of unsatisfied check nodes for a decoding result of the hard decision decoding; and
generate a soft log-likelihood ratio (LLR) for the symbol value based on the number of satisfied check nodes and the number of unsatisfied check nodes, wherein the soft decision decoder further comprises circuitry to perform the soft decision decoding on the codeword using the soft LLR as an input.

20. The system of claim 19, wherein the soft LLR generator is configured to generate the soft LLR according to an equation P=((#S−#U)*Q+1)*D*X, in which P is the soft LLR for the symbol value, #S is the number of satisfied check nodes, #U is the number of unsatisfied check nodes, Q is a scaling factor, D is the symbol value, X is an original LLR magnitude assigned to the symbol value, and "*" is a multiplication sign, wherein the scaling factor Q and the original LLR magnitude X are selected to satisfy a hardware constraint.

* * * * *